United States Patent [19]

Ochiai

[11] Patent Number: 5,202,888
[45] Date of Patent: Apr. 13, 1993

[54] SEMICONDUCTOR MEMORY DEVICE HAVING A MULTIBIT PARALLEL TEST FUNCTION AND A METHOD OF TESTING THE SAME

[75] Inventor: Kazuaki Ochiai, Tenri, Japan
[73] Assignee: Sharp Kabushiki Kaisha, Japan
[21] Appl. No.: 500,601
[22] Filed: Mar. 28, 1990

[30] Foreign Application Priority Data

Mar. 30, 1989 [JP] Japan .................................. 1-80666

[51] Int. Cl.[5] ............................................ G11C 29/00
[52] U.S. Cl. .................. 371/21.2; 371/21.1; 371/15.1; 371/3
[58] Field of Search ............ 371/21.2, 21.1, 15.1, 371/3, 22.1

[56] References Cited
U.S. PATENT DOCUMENTS

| | | | |
|---|---|---|---|
| 4,049,956 | 9/1977 | Van Veen | 371/21.1 |
| 4,481,627 | 11/1984 | Beauchesne et al. | 371/21.1 |
| 4,602,369 | 7/1986 | Murakami et al. | 371/25.1 |
| 4,742,293 | 5/1988 | Koo et al. | 371/22.3 |
| 4,879,717 | 11/1989 | Sauerward et al. | 371/25.1 |
| 4,970,727 | 11/1990 | Miyawaki et al. | 371/21.3 |

*Primary Examiner*—Charles E. Atkinson
*Assistant Examiner*—Ly V. Hua
*Attorney, Agent, or Firm*—Nixon & Vanderhye

[57] ABSTRACT

A semiconductor memory device has a multibit parallel test function and a method of testing such a memory device. The memory device comprises a multibit parallel writing circuit (2) and a multibit parallel check circuit (3). The method comprises the steps of: inputting test data into a memory unit through an input (4) while setting the multibit parallel writing circuit (2) to the ON state by a control circuit; reading out the multibit test data from the memory unit, while setting the multibit parallel check circuit (3) to the OFF state, thereby conducting the test of the multibit parallel writing circuit (2) inputting multibit test data into the memory unit through the input, while setting the multibit parallel writing circuit (2) to the OFF state by the control circuit; and reading out the multibit test data from the memory unit, while setting the multibit parallel check circuit (3) to the ON state, thereby conducting the test of said multibit parallel check circuit (3).

3 Claims, 3 Drawing Sheets

SEMICONDUCTOR MEMORY DEVICE HAVING A MULTIBIT PARALLEL TEST FUNCTION AND A METHOD OF TESTING THE SAME

BACKGROUND OF THE INVENTION

1. Field of the Invention

This invention relates to a semiconductor memory device (such as a DRAM and SRAM) having a multibit parallel test function which includes multibit parallel writing and multibit parallel checking functions, and also to a method of testing the multibit parallel test function of such a semiconductor memory.

2. Description of the Prior Art

Recently, semiconductor memory devices tend to have greater storage capacity, and accordingly the test of such devices requires much more time. Hitherto, however, the length of time involved in testing such a memory device has not been of consideration, and, therefore, no importance has been placed on the provision of a circuit for testing multiple bits in parallel. Indeed, no such circuit has been in use. Hence, no method has been developed for testing a multibit parallel testing function incorporated in a semiconductor memory device.

It can be anticipated that with further increases in the storage capacity of a semiconductor memory device, it will be required to reduce the time involved in testing. In such a situation, it may be necessary to incorporate a function of performing a multibit parallel test into one chip together with a semiconductor memory device. In such a semiconductor memory device, it will be necessary to test the multibit parallel test function incorporated in the memory device.

SUMMARY OF THE INVENTION

The semiconductor memory memory device of this invention, which overcomes the above-discussed and numerous other disadvantages and deficiencies of the prior art, comprises a memory means, and a multibit parallel test means, said semiconductor memory device further comprises: a control means for controlling the ON/OFF state of said multibit parallel test means; an input means for inputting test data generated outside, in parallel into said memory means; and an output means for outputting said multibit test data from said memory means.

In a preferred embodiment, the multibit parallel test means comprises a multibit parallel write means and a multibit parallel check means.

The method of this invention, which comprises the steps of: inputting test data into said memory means through said input means, while setting said multibit parallel write means to the ON state by said control means; reading out said multibit test data from said memory means, while setting said multibit parallel check means to the OFF state, thereby conducting the test of said multibit parallel write means; inputting multibit test data into said memory means through said input means, while setting said multibit parallel write means to the OFF state by said control means; and reading out said multibit test data from said memory means, while setting said multibit parallel check means to the ON state, thereby conducting the test of said multibit parallel check means.

Thus, the invention described herein makes possible the objectives of:

(1) providing a semiconductor memory device comprising a function of performing a multibit parallel test; and (2) providing a method of testing the test function of a semiconductor memory device in which the multibit parallel test function is incorporated.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
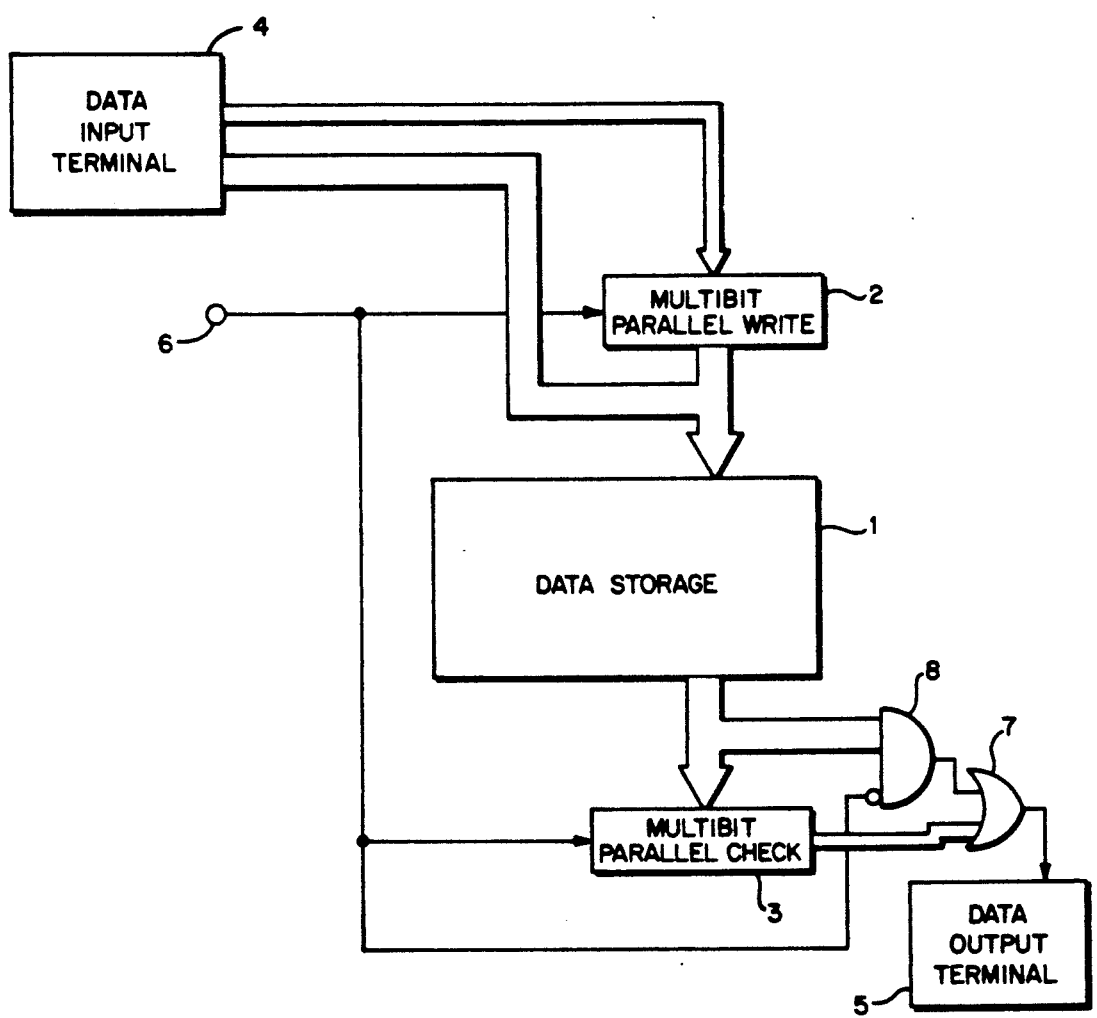
FIG. 1 is a block diagram of a semiconductor memory device of the invention.

FIG. 1 is a block diagram showing a semiconductor memory device according to the invention. In the semiconductor memory device shown in FIG. 1, a memory means or data storage area 1, a multibit parallel writing circuit 2, and a multibit parallel check circuit 3 are arranged within one semiconductor chip. The multibit parallel writing circuit 2 and multibit parallel check circuit 3 are circuits for performing a multibit parallel test function.

A multibit parallel test function ON/OFF control signal (hereinafter referred to as a "control signal") is input to a control signal input terminal 6. When the control signal is input, the multibit parallel writing circuit 2 and multibit parallel check circuit 3 are operated so as to determine whether the multibit parallel write and check functions operate properly or not. When the multibit parallel write function is set to the ON state by a control signal, the multibit parallel writing circuit 2 operates to expand one data supplied through a data input terminal 4 into multibit data, and to output the multibit data in parallel. The multibit data generated by the multibit parallel writing circuit 2 are input to the data storage area 1 and stored therein. When the multibit parallel check function is set to the ON state, the multibit parallel check circuit 3 compares the multibit data read in parallel from the data storage area 1, one to another, and outputs signal "1" if the data are identical, or if not, signal "0". The output signal from the multibit parallel check circuit 3 is delivered outward through an OR gate 7 and an output terminal 5.

When the multibit parallel check function is set to the OFF state by the control signal, the data read in parallel from the data storage area 1 appear at the data output terminal 5 passing through switching means comprised of AND gate 8 and the OR gate 7.

When a timing signal for CAS (column address strobe) before RAS (row address strobe) refresh is entered into the semiconductor memory device and, at the same time, the WE (Write Enable) signal is caused to be LOW, a control signal for setting the multibit parallel write and check functions to the ON state is input from a control circuit (not shown) to the control signal input terminal 6. Hereinafter, the multibit parallel write and check functions are generally referred to as "multibit parallel test function". After the control signal is input to the control signal input terminal 6, the multibit parallel test function is maintained in the ON state, until a timing signal for CAS before RAS refresh or a timing signal for RAS only refresh is applied to the control circuit so that a control signal for setting the multibit parallel test function to the OFF state is sent from the control circuit to the input terminal 6.

In the semiconductor memory device shown in FIG. 1, the data input terminal 4 and the data output terminal 5 are separately disposed, but alternatively one terminal or group of terminals may be employed for both data input and data output purposes.

Figure 2:
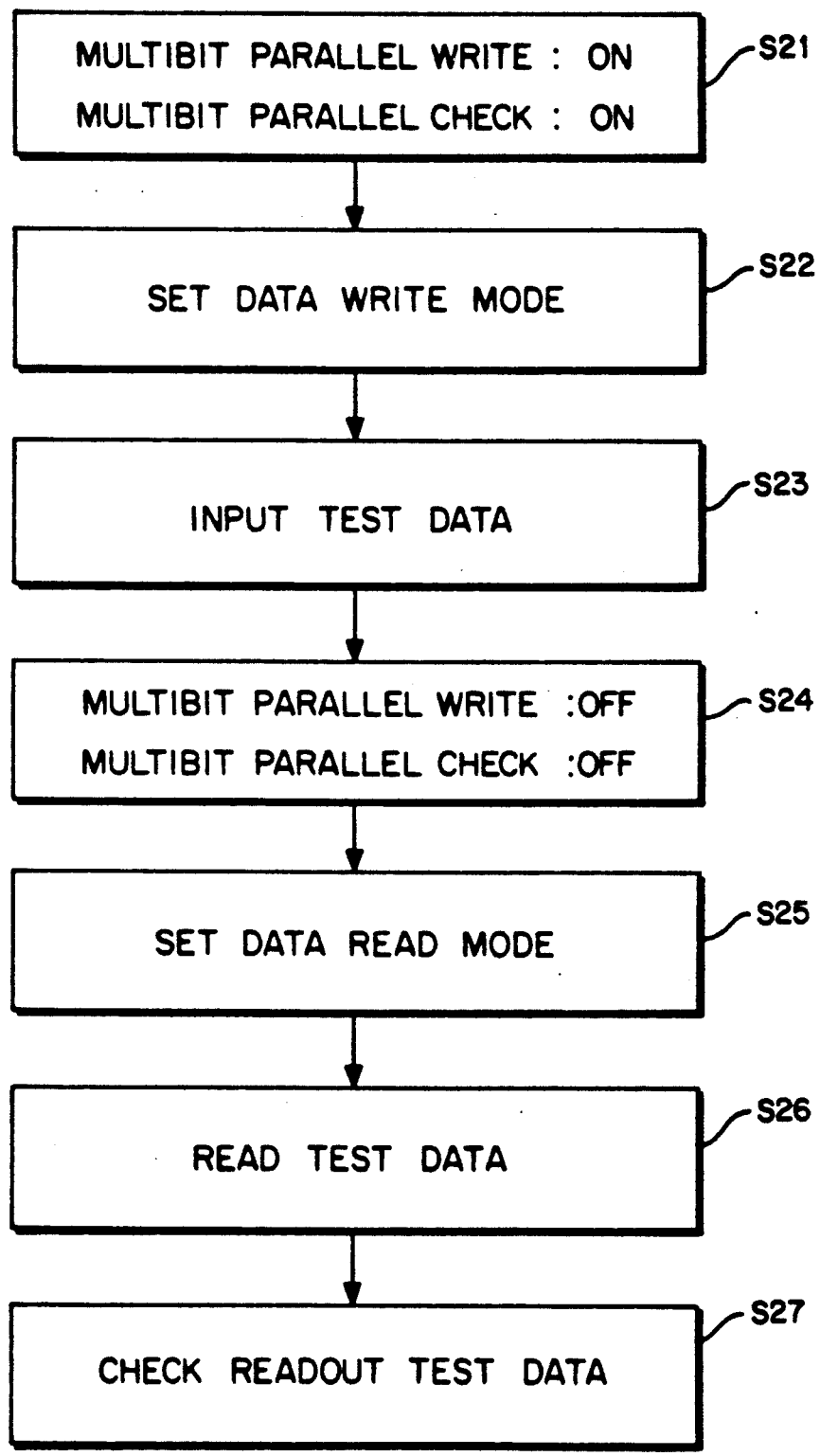
FIG. 2 is a flowchart illustrating the test of the multibit parallel write of the memory device of FIG. 1.

The manner of testing the multibit parallel writing circuit 2 will now be described with reference to FIG. 2. A testing unit (not shown) is connected to the semiconductor memory device of FIG. 1. The testing unit generates a timing signal for CAS before RAS refresh and the WE signal (LOW level), both for one cycle. When these signals are supplied into the semiconductor memory device, the multibit parallel test function of the semiconductor memory device is set to the ON state (step S21). The semiconductor memory device is set to the data write mode (step S22). Subsequently, test data is fed from the testing unit to the data input terminal 4. Multibit data are generated by the multibit parallel writing circuit 2 on the basis of the input test data, and the generated data are stored in memory elements of the data storage area 1 (step S23). Then, the testing unit generates a timing signal for CAS before RAS refresh or RAS only refresh for one cycle, and the signal is supplied to the semiconductor memory device, whereby the multibit parallel test function of the semiconductor memory device is set to the OFF state (step S24). The semiconductor memory device is set to the data read mode (step S25). After this setting, the data previously written by the multibit parallel writing circuit 2 are read from the data storage area 1 (step S26). The readout data are supplied as such to the testing unit through the data output terminal 5. The testing unit checks the data to determine whether or not the multibit parallel writing circuit 2 is operating in a normal manner (step S27).

Figure 3:
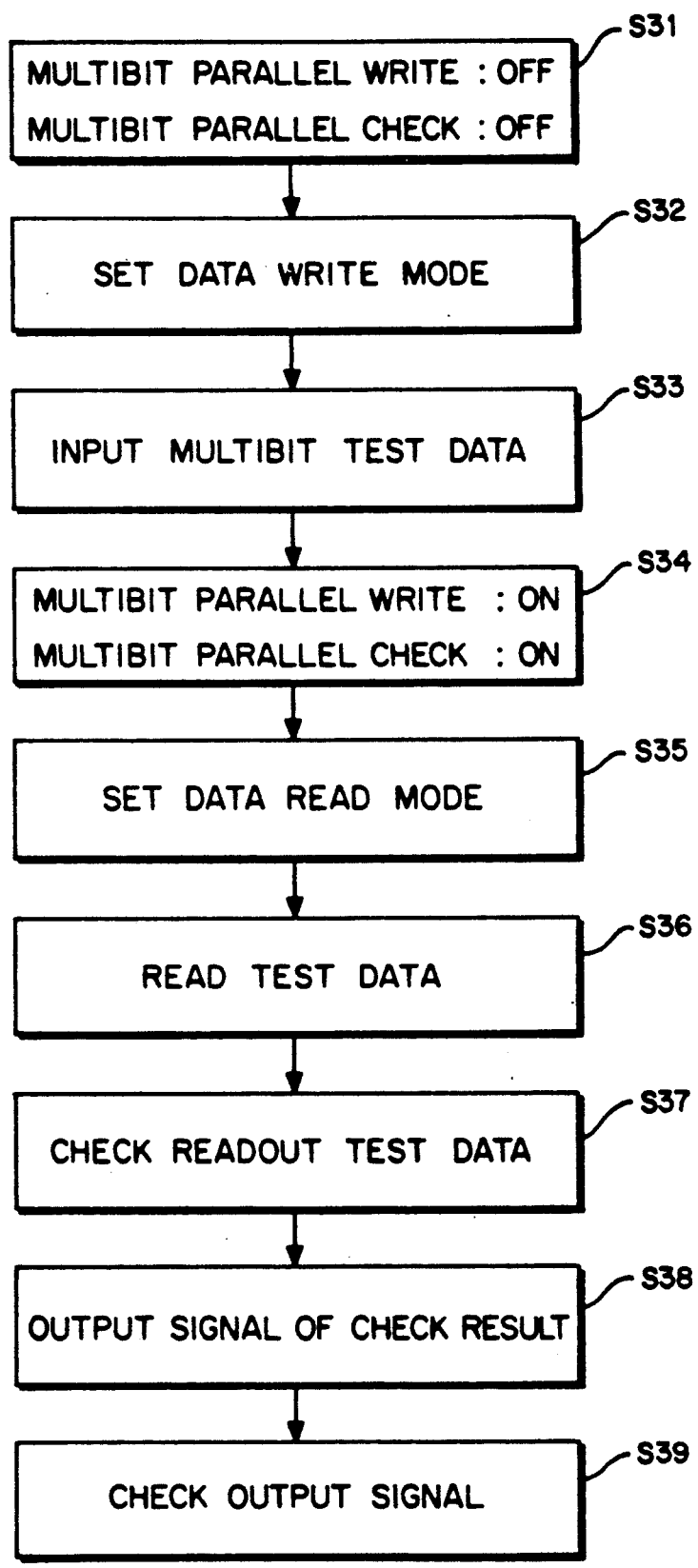
FIG. 3 is a flowchart illustrating the test of the multibit parallel check function of the memory device of FIG. 1.

The manner of testing the multibit parallel check circuit 3 will be described with reference to FIG. 3. The testing unit connected to the semiconductor memory device of FIG. 1 generates a timing signal for CAS before RAS refresh or RAS only refresh for one cycle, and applies the signal to the semiconductor memory device, whereby the multibit parallel test function of the semiconductor memory device is set to the OFF state (step S31). The semiconductor memory device is set to the data write mode (step S32). Subsequently, multibit test data are input from the testing unit to the data input terminal 4 of the semiconductor memory device, and are stored as it is in memory elements of the data storage area 1 (step S33). Then, the testing unit generates a timing signal for CAS before RAS refresh and the WE signal (LOW level), both for one cycle, and the signals are supplied to the semiconductor memory device so that the multibit parallel test function of the semiconductor memory device is set to the ON state (step S34). The semiconductor memory device is set to data read mode (step S35). After this setting, the data previously written are read from the data storage area 1 (step S36). The readout data are checked by the multibit parallel check circuit 3 (step S37). The multibit parallel check circuit 3 outputs a signal indicative of check-up results through the data output terminal 5 (step S38). The signals are input to the testing unit, which in turn checks on the signals to determine whether or not the multibit parallel check circuit 3 operates in a normal manner (step S39).

In this way, according to the invention, a multibit parallel test function incorporated in a semiconductor memory device can be easily tested.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device comprising a memory means, said semiconductor memory device further comprises:
   a multibit parallel write means connected to said memory means;
   a multibit parallel check means connected to said memory means;
   an input means connected to said memory means, said write means, and said multibit parallel check means, for receiving a control signal and test data from outside, said control signal being indicative of the ON/OFF state of said multibit parallel write means and check means, said test data being supplied in parallel into said memory means when said multibit parallel write means is in the ON state;
   switching means, connected to said memory means and said input means, for receiving said multibit test data and said control signal and for passing said multibit test data according to said control signal;
   an output means, connected to said memory means via said switching means and said multibit parallel check means, for outputting said multibit test data from said memory means when said multibit parallel check means in in the OFF state,
   said memory means, said multibit parallel write means, and said multibit parallel check means being formed within one semiconductor chip.

2. A method of testing a multibit parallel function of a semiconductor memory device, the semiconductor memory device comprising an input means connected to a memory means, for receiving a control signal, test data and multibit data from outside; a multibit parallel write means, connected to said memory means and said input means, for receiving said test data and said control signal from said input means and for generating multibit test data from said test data in accordance with said control signal; a multibit parallel check means, connected to said memory means and input means for receiving said multibit test data from said memory means and said control signal; a switching means connected to said memory means and said input means; and an output means connected to said memory means via said switching means and said check means, the method comprising the steps of:
   (1) testing the multibit parallel write means by:
       setting said multibit parallel write means to the ON state by said control signal;
       inputting said test data into said memory means through said multibit parallel write means, while said multibit parallel write means is set to the ON state;

reading out said multibit test data from said memory means, while said multibit parallel check means is set to the OFF state;

outputting said multibit test data through said output means; and (2) testing the multibit parallel check means by:

setting said multibit parallel write means to the OFF state by said control signal;

inputting said multibit data into said memory means through said input means, while said multibit parallel write means is set to the OFF state;

setting said multibit parallel check means to the ON state by said control signal;

reading out said multibit data from said memory means, while said multibit parallel check means is set to the ON state; and outputting a signal indicative of check-up data through said output means.

3. In a semiconductor memory device comprising a memory means, said semiconductor memory device further comprises:

input means, connected to said memory means, for receiving a control signal and test data from outside;

multibit parallel write means, connected to said memory means and said input means, for receiving said test data and said control signal from said input means and for generating multibit test data from said test data in accordance with said control signal;

a multibit parallel check means, connected to said memory means and said input means, for receiving said multibit test data from said memory means and said control signal and for generating check-up data by checking said multibit test data according to said control signal;

said control signal being indicative of the ON/OFF state of said multibit parallel write means and said multibit parallel check means, said multibit test data being supplied in parallel into said memory means when said multibit parallel write means is in the ON state;

switching means, connected to said memory means and said input means, for receiving said multibit test data and said control signal and for passing said multibit test data according to said control signal;

an output means, connected to said memory means via said switching means and said multibit parallel check means, for outputting said multibit test data from said memory means when said multibit parallel check means is in the OFF state, and for outputting said check-up data from said multibit parallel check means when said multibit parallel check means is in the ON state, and said memory means, said multibit parallel write means, and said multibit parallel check means being formed within one semiconductor chip.

* * * * *